United States Patent
Tao et al.

(10) Patent No.: US 10,224,955 B2
(45) Date of Patent: Mar. 5, 2019

(54) DATA COMPRESSION AND DECOMPRESSION METHOD OF DEMURA TABLE, AND MURA COMPENSATION METHOD

(71) Applicant: Shenzhen China Star Optoelectronics Technology Co., Ltd., Shenzhen (CN)

(72) Inventors: Qiujian Tao, Shenzhen (CN); Shen Sian Syu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/328,521

(22) PCT Filed: Jan. 5, 2017

(86) PCT No.: PCT/CN2017/070218
§ 371 (c)(1),
(2) Date: Jul. 7, 2017

(87) PCT Pub. No.: WO2018/040463
PCT Pub. Date: Mar. 8, 2018

(65) Prior Publication Data
US 2018/0191371 A1    Jul. 5, 2018

(30) Foreign Application Priority Data
Aug. 31, 2016 (CN) .......................... 2016 1 0796108

(51) Int. Cl.
G06K 9/00 (2006.01)
H03M 7/30 (2006.01)
G06F 3/147 (2006.01)
G09G 3/36 (2006.01)

(52) U.S. Cl.
CPC .......... *H03M 7/3062* (2013.01); *G06F 3/147* (2013.01); *G09G 3/36* (2013.01); *H03M 7/30* (2013.01); *G09G 2300/043* (2013.01)

(58) Field of Classification Search
None
See application file for complete search history.

(56) References Cited

U.S. PATENT DOCUMENTS

2010/0013751 A1 * 1/2010 Kerofsky ............... G09G 3/006 345/89
2015/0187306 A1 * 7/2015 Syu ....................... G09G 3/3655 345/87
2016/0163246 A1 * 6/2016 Lee ....................... G09G 3/2003 345/690

OTHER PUBLICATIONS

Machine translation of CN 201510446103 (Year: 2015).*

* cited by examiner

*Primary Examiner* — Hadi Akhavannik

(57) ABSTRACT

Disclosed is a data compression method of DeMura Table, a data decompression method of DeMura Table, and a Mura compensation method. The data compression method includes: acquiring image information of a display panel and obtaining an original DeMura Table; performing region extraction based on the original DeMura Table; performing edge detection based on the Mura region obtained from extraction; distributing each sub-pixel element included in the display panel as per results from the region extraction and the edge detection to determine a numerical value of each sampling point in the DeMura Table. The method may save storage costs of DeMura Table.

9 Claims, 5 Drawing Sheets

DATA COMPRESSION AND DECOMPRESSION METHOD OF DEMURA TABLE, AND MURA COMPENSATION METHOD

CROSS-REFERENCE TO RELATED APPLICATIONS

The present application claims the priority of Chinese Patent Application CN 201610796108.5, filed on Aug. 31, 2016, and entitled "Method for Data Compression and Decompression Method of DeMura Table and Mura Compensation Method," the entirety of which is incorporated herein by reference.

FIELD OF THE INVENTION

The present disclosure pertains to the field of liquid crystal display, and more particularly relates to a method for data compression and decompression method of DeMura Table and Mura compensation method.

BACKGROUND OF THE INVENTION

Mura refers to a phenomenon of various marks resulting from nonuniform brightness on a display panel. DeMura is actually a process for compensation of Mura. Mura information on the panel is acquired from the brightness of images in photographing panel of a camera, followed by extraction and correction of the Mura through some algorithm to finally obtain a DeMura Table to be used for interpolating by hardware (such as a processor). Generally, Mura information is acquired by a camera, and a personal computer is used to process this information to obtain a compensation table which is finally burnt into a memory device (such as a Flash). The above process is as shown in FIG. 1.

Subsequently, the compensation table is always large in size in the prior art due to relatively complex process of DeMura. This has a great influence on the cost of a liquid crystal display. It may be said that the compensation table determines the capacity of a Flash, and thus it has become a problem to be solved how to effectively compress the size of the compensation table to save costs for Flash production.

SUMMARY OF THE INVENTION

One of the technical problems to be solved by the present disclosure is to provide a method for effectively compressing the size of a compensation table during a DeMura process to save the costs.

To solve the above technical problem, in an embodiment of the present disclosure, a data compression method of DeMura Table is first provided, comprising the steps of: acquiring image information of a display panel; processing the image information by a DeMura algorithm to obtain an original DeMura Table; performing region extraction based on the original DeMura Table to designate a range of Mura region; performing edge detection based on the Mura region obtained from the extraction to acquire boundary information of the Mura region; and distributing each sub-pixel element included in the display panel as per results from the region extraction and edge detection to determine a numerical value of each sampling point in the DeMura Table.

Preferably, the step of acquiring the image information of the display panel comprises: dividing sub-pixel elements included in the display panel into four partitions; acquiring image information of the four partitions respectively; and acquiring image information of a whole display panel based on the image information of the four partitions.

Preferably, four sub-pixels obtained from intersecting each two rows and two columns are grouped into one block, and the four sub-pixels in the block belong to four different partitions.

Preferably, the step of performing region extraction based on the original DeMura Table to designate a range of the Mura region, comprises: calculating a mean value of data in the Table based on the original DeMura Table; comparing each datum in the original DeMura Table with the mean value; and determining that a sub-pixel element corresponding to a compared datum is included in the Mura region when an absolute value of a difference between the compared datum and the mean value is greater than a preset threshold, or determining that a sub-pixel element corresponding to a compared datum is not included in the Mura region when an absolute value of a difference between the compared datum and the mean value is smaller than or equal to the preset threshold.

Preferably, the step of distributing each sub-pixel element included in the display panel as per results from the region extraction and edge detection to determine a numerical value of each sampling point in the DeMura Table, comprises: determining, if a sub-pixel element is not included in the Mura region or completely included in the Mura region, a sub-pixel element of a selected partition from a block to which the sub-pixel element not included in the Mura region or completely included in the Mura region belongs as a sampling point of the block, and taking data in the original DeMura Table corresponding to the sub-pixel element in the selected partition as the numerical value of the sampling point of the block; or taking, if a sub-pixel element is boundary of the Mura region, the sub-pixel element as the sampling point of the block to which the sub-pixel element belongs, and taking data in the original DeMura Table corresponding to the sub-pixel element as the numerical value of the sampling point of the block.

Preferably, it also comprises storing the partition to which the sampling point of each block represented by two binary numbers belongs and the numerical value of the sampling point together as a new DeMura Table after determining that the numerical value for each sampling point in the DeMura Table has been obtained.

In the embodiment of the present disclosure, also provided is a data decompression method of DeMura Table, comprising the steps of: acquiring numerical values of sampling points for nine adjacent blocks including a block at which a sub-pixel element to be interpolated locates; removing points not included in a Mura region from the sampling points of the nine adjacent blocks if the sub-pixel element to be interpolated is completely included in the Mura region or is boundary of the Mura region, or removing points completely included in the Mura region or being boundaries of a Mura region from the sampling points of the nine adjacent blocks if the sub-pixel element to be interpolated is not included in the Mura region; calculating a distance between the sampling point of each adjacent block and the sub-pixel element to be interpolated; calculating weight of each corresponding sampling point as per an obtained value of each distance; and determining value of data in the DeMura Table corresponding to the sub-pixel element to be interpolated as per the numerical value and the weight of each sampling point.

Preferably, the weight $\lambda_i$ corresponding to each sampling point is calculated as per the following equation:

$$\lambda_i = \frac{\frac{1}{D_i}}{\sum_{i=1}^{n} \frac{1}{D_i}},$$

wherein, $D_i$ is the distance between the sampling point of each adjacent block and the sub-pixel element to be interpolated; n is the number of sampling points of the adjacent blocks; and i is a natural number indicating the sampling point of each adjacent block.

Preferably, value $V_P$ of data in the DeMura Table corresponding to the sub-pixel element to be interpolated is determined as per the following equation:

$$V_P = \sum_{i=1}^{n} V_i * \lambda_i,$$

wherein, $V_i$ is the numerical value of the sampling point of each adjacent block; $\lambda_i$ is the weight of the sampling point corresponding to each adjacent block; n is the number of the sampling points of the adjacent blocks; and i is a natural number indicating the sampling point of each adjacent block.

According to another aspect of the present disclosure, a Mura compensation method is also provided, comprising: performing data compression on the original DeMura Table by using the above data compression method of DeMura Table, and storing compressed DeMura Table in a flash; reading the compressed DeMura Table from the flash, and performing decompression on the compressed DeMura Table by using the above data decompression method of DeMura Table to acquire Mura compensation values containing all sub-pixel elements of a liquid crystal panel; and performing Mura compensation of the liquid crystal panel by using the Mura compensation values.

Compared with the prior art, one or more embodiments of the above solutions may have the following advantages or beneficial effects.

Through block arrangement and distribution of the sampling points, data compression of the original DeMura Table is realized, and data are decompressed through Inverse Distance to a Power and position information of the sampling points, thereby effectively reducing storage costs of DeMura Table. There is only small loss of data during compression and decompression thereof, and operations are simple to facilitate implementation.

Other advantages, objectives, and features of the present disclosure will be set forth in part in the description which follows and in part will become apparent to those having ordinary skill in the art upon examination of the following or may be learned from practice of the present disclosure. Objectives and other advantages of the present disclosure can be realized and obtained from the following description, claims, and structures specially indicated in the accompanying drawings.

BRIEF DESCRIPTION OF THE DRAWINGS

Accompanying drawings are used for providing further understanding of technical solutions of the present disclosure or the prior art and constitute a part of the description, wherein, the accompanying drawings for expressing embodiments of the present disclosure and the embodiments of the present disclosure are used together to explain the technical solutions of the present disclosure, and are not constructed to limit the technical solutions of the present disclosure.

DETAILED DESCRIPTION OF THE EMBODIMENTS

Implementations of the present disclosure will be described below in detail in conjunction with accompanying drawings and embodiments, whereby the process to solve technical problems by the technical means of the present disclosure, so as to achieve corresponding technical effects may be fully understood and thus implemented. Embodiments of the present disclosure as well as features in the embodiments may be combined with each other without conflict, and the formed technical solutions are in the scope of the present disclosure.

Figure 1:
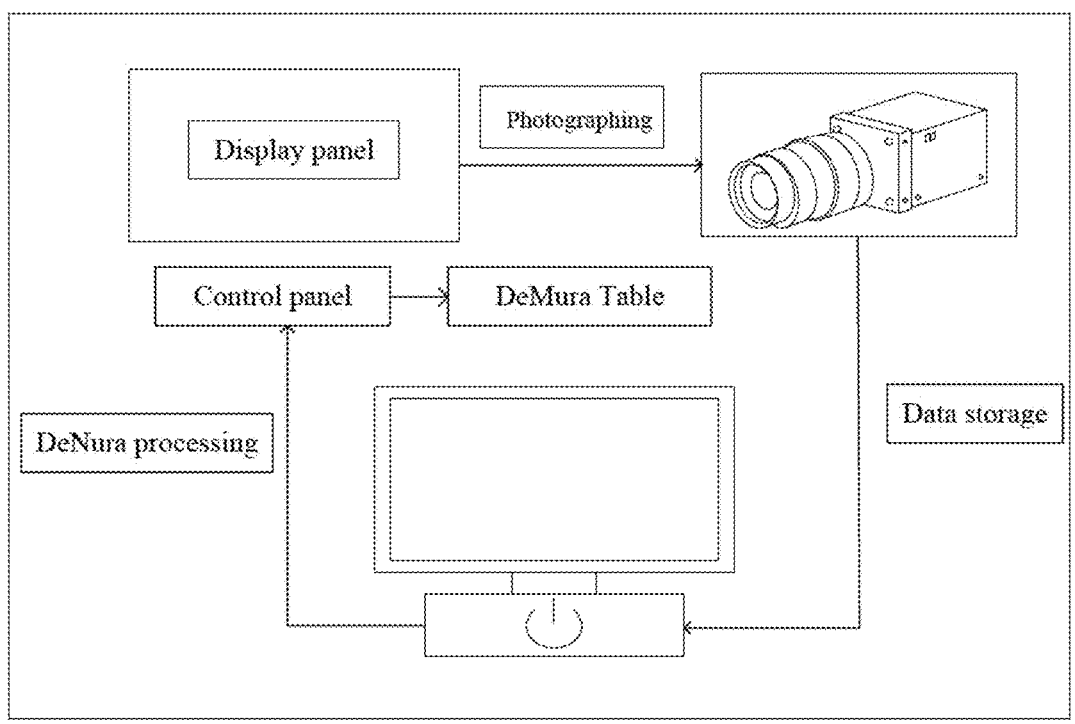
FIG. 1 is a diagram for Mura compensation by implementing DeMura in the prior art.
Figure 2:
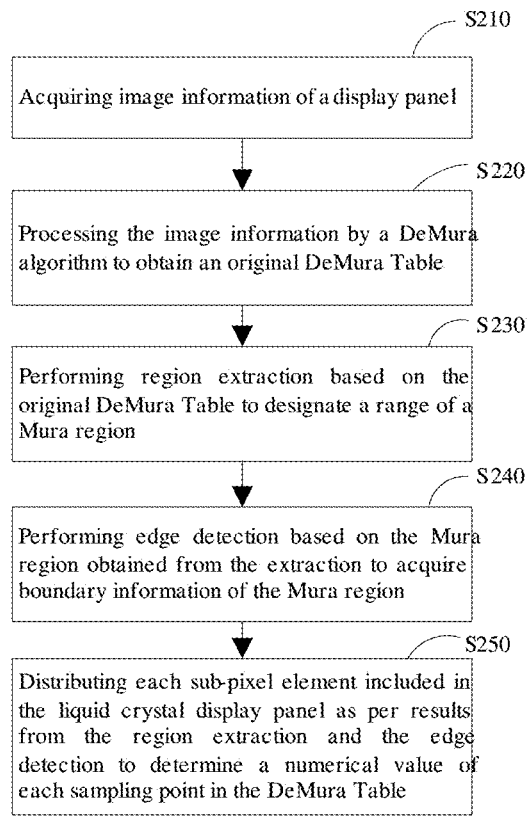
FIG. 2 is a flow chart of a data compression method of DeMura Table, according to an embodiment of the present disclosure.

FIG. 2 is a flow chart of a decompression method of DeMura Table according to an embodiment of the present disclosure. The data compression method comprises the following steps.

In step S210, image information of a display panel is acquired.

In step S220, the image information of the display panel is processed by a DeMura algorithm, to obtain an original DeMura Table.

In step S230, region extraction is performed based on the original DeMura Table, to designate a range of Mura region.

In step S240, edge detection is performed based on the Mura region obtained from the extraction, to acquire boundary information of the Mura region.

In step S250, respective sub-pixel elements included by the display panel are distributed as per the results of the region extraction and edge detection, to determine a numerical value of each sampling point in the DeMura Table.

Particularly, in step S210, sub-pixel elements included by the display panel is first divided into four partitions. Then image information of each partition is acquired. Next, image information of the whole display panel is acquired based on the image information of all the partitions, and image information of the four partitions is put together into complete information.

Figure 3:
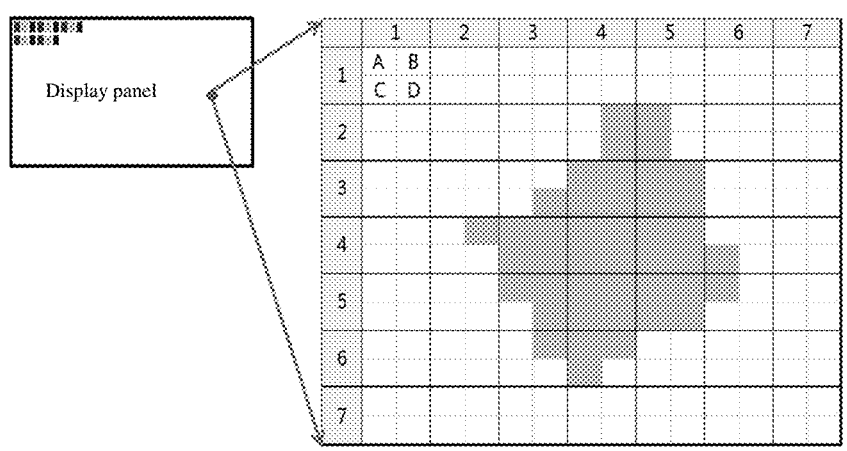
FIG. 3 is a diagram for photographing gray scale images for a display panel, according to an embodiment of the present disclosure.

While acquiring gray scale information of the display panel, a panel image is divided into four images A/B/C/D for photographing by partitions, as shown in FIG. 3, and four sub-pixel elements obtained by intersecting each two rows and two columns (2*2 matrix) are grouped as one block, and the four sub-pixel elements in the block belong to four different partitions and naming begins from The sub-pixel elements are named from an upper left corner, and in anti-clockwise direction, belong to Partition A, Partition B, Partition C, and Partition D, respectively. As such, the display panel is divided into several blocks, and gray scale information of the four sub-pixel elements in each block is acquired in four different photographing processes respectively.

The reason for photographing by partitions for the display panel is that, generally, brightness of pixel A may be inaccurate due to influence by surrounding pixels BCD when being acquired, if resolution of CCD of camera is close to the resolution of the actual panel. Thus, in embodiments of the present disclosure, an image is divided into four images A/B/C/D for photographing, which may reduce interference by surrounding pixels and allow more CCD to correspond to one pixel to acquire more accurate pixel brightness.

Next in step S220, existing DeMura algorithm is used to process the image information after photographing the four images A/B/C/D. Uniformity of display is improved mainly through adjusting gray scale coefficient of the Mura region and setting the gray scale coefficient to be same as the gray scale coefficient in a normal display region.

The original DeMura Table obtained from processing by a DeMura algorithm is recorded as DTorigin. If a gray scale numerical value of a sub-pixel element is represented by 8 binary numbers, then the size of the original DeMura Table is DTorigin=4*8 bit*Blocks (Blocks refer to the number of blocks included in the display panel). In other words, if a flash is used to store the original DeMura Table, its capacity cannot be less than 4*8 bit*Blocks.

Following is the process for data compression of the original DeMura Table in detail.

In step S230, the extraction process of the Mura region further comprises calculating the mean value of data in the Table based on the original DeMura Table. Each datum in the original DeMura Table is compared with the mean value obtained from calculation. A sub-pixel element corresponding to the compared data is determined as included in the Mura region if an absolute value of a difference between the compared datum and the mean value is greater than a preset threshold, and the sub-pixel element corresponding to the compared data is determined as being not included in the Mura region if the absolute value of the difference between the compared datum and the mean value is less than or equal to the preset threshold, wherein, the preset threshold may be determined as per display effect of the display panel.

For example, mean value x_avg of gray scale data for all sub-pixel elements in a compensation image of the original DeMura Table is calculated, and threshold is set. Then a Mura region is determined when |x_ij−x_avg|>threshold, and a finally extracted Mura region as obtained is shown by a shade colour region at the middle of the image in FIG. 4.

In step S240, data in the original DeMura Table is subject to a binarization on the basis of extraction of the Mura region, and edge detection is made based on the DeMura Table after binarization, to obtain edge information of the Mura region. In practice, this may be implemented by using edge detection method in the prior art. For example, canny algorithm is used in an embodiment of the present disclosure, such as DTedge=(imIn,'canny').

Figure 4:
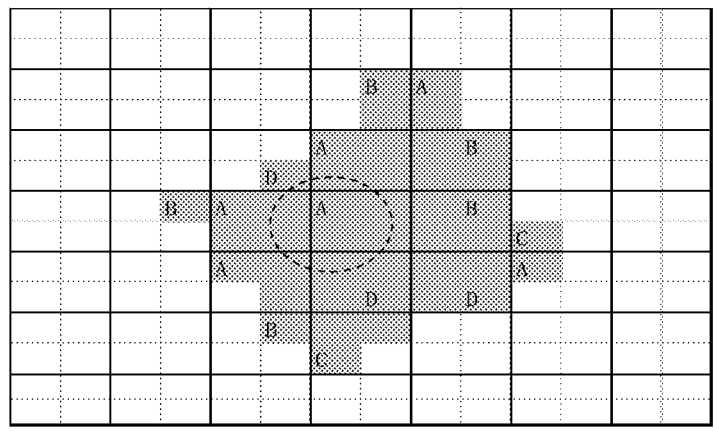
FIG. 4 is a diagram for Mura region extraction and edge detection for DeMura Table, according to an embodiment of the present disclosure.

The implementation result of this step is as shown in FIG. 4, wherein each sub-pixel element marked by a letter is an edge point obtained from edge detection, except the block circled by a dotted-line frame in the figure.

In step S250, the process for distributing respective sub-pixel elements included in the display panel further comprises: examining all sub-pixel element points one by one.

If a sub-pixel element is not included in the Mura region or completely included in the Mura region, a sub-pixel element of a selected partition in the block to which the sub-pixel element not included in the Mura region or completely included in the Mura region belongs is determined as the sampling point of the block, and the data in the original DeMura Table corresponding to the sub-pixel element in the selected partition is taken as the numerical value of the sampling point of the block.

If a sub-pixel element is the boundary of the Mura region, the sub-pixel element is taken as the sampling point of the block to which the sub-pixel element belongs, and the data in the original DeMura Table corresponding to the sub-pixel element is taken as the numerical value of the sampling point of the block.

Figure 5:
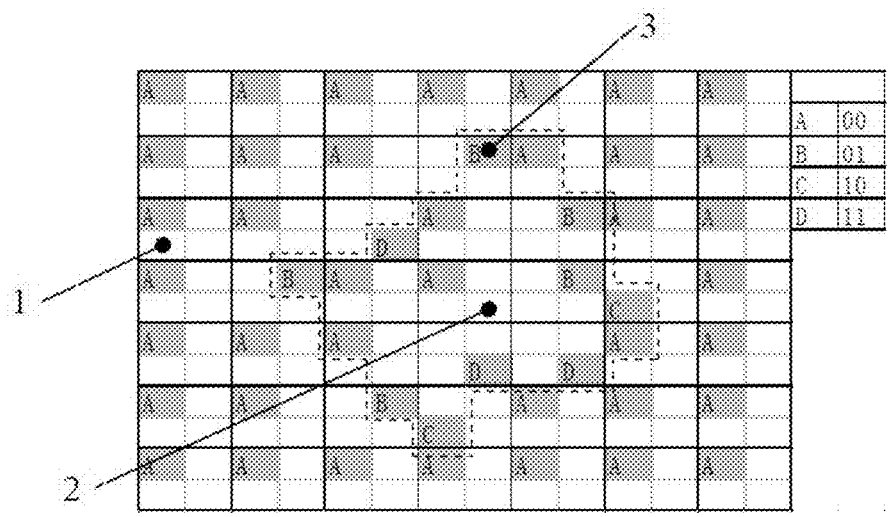
FIG. 5 is a diagram for distribution of respective sub-pixel elements in the DeMura Table, according to an embodiment of the present disclosure.

Following illustration is done in conjunction with FIG. 5, wherein the region circled by a dotted-line frame is a Mura region. As shown in FIG. 5, point 1 is a sub-pixel element not included in the Mura region, and the point 1 locates at a lower left corner in the block to which it belongs. That is to say, the point 1 belongs to Partition C. In the embodiments of the present disclosure, Partition A is selected as a default partition, and therefore, for the point 1, a point belonging to Partition A in the block at which the point 1 locates is taken as the sampling point of the block, i.e., other three points (three sub-pixel elements) comprising the point 1 in the block at which the point 1 locates are omitted and not stored.

Point 2 is a sub-pixel element completely included in the Mura region, and the point 2 locates at a lower right corner in the block to which the sub-pixel element belongs, i.e., the point 2 belongs to Partition D. Similarly, for the point 2, a point belonging to Partition A in the block at which the point 2 locates is taken as the sampling point of the block, i.e., other three points (three sub-pixel elements) comprising the point 2 in the block at which the point 2 locates are omitted and not stored.

Point 3 is a sub-pixel element at the boundary of the Mura region, and then the sub-pixel element is taken as the sampling point of the block to which the sub-pixel element belongs, i.e., other three points (three sub-pixel elements) except the point 3 are omitted and not stored.

It should be appreciated that since display panel is divided into blocks in the embodiments of the present disclosure, it may be possible for several boundary points to be simultaneously included in a same block during edge detection. In such case, further distribution is necessary in accordance with specific locations of the boundary points in the Mura region to which they belong. In particular, coordinate information of each boundary point is obtained according to results from edge detection, and judgment is made to determine which portion of the Mura region it locates based on the coordinate information of each boundary point. Different distribution strategies are prepared for different portions of the Mura region to perform distribution on the sampling points.

For example, boundary coordinates in upper, lower, left and right directions in each boundary point are first determined. Horizontal coordinates for all boundary points Pij are compared with each other, and a minimum value MinPi of the horizontal coordinate is determined as a leftmost coordinate point of the Mura region and recorded as Lij, and a maximum value MaxPi of the horizontal coordinate is determined as a rightmost coordinate point of the Mura region and recorded as Rij. Vertical coordinates for all boundary points Pij are compared with each other, and a minimum value MinPj of the vertical coordinate is determined as a topmost coordinate point of the Mura region and recorded as Tij, and a maximum value MaxPj of the vertical coordinate is determined as a bottommost coordinate point of the Mura region and recorded as Bij.

Then the coordinate Pij of each boundary point is compared with the Lij, Rij, Tij and Bij to determine specific portion of the Mura region at which the boundary point belongs. For example, it is judged as at left side of the Mura region when Pi=Li; it is judged as at right side of the Mura region when Pi=Ri; it is judged as at top side of the Mura region when Pj=Tj; and it is judged as at bottom side of the Mura region when Pj=Bj.

Further, it is judged as at top left side of the Mura region when Li<Pi<Ti and Tj<Pj<Lj; it is judged as at top right side of the Mura region when Ti<Pi<Ri and Tj<Pj<Rj; it is judged as at bottom left side of the Mura region when Li<Pi<Bi and Lj<Pj<Bj; and it is judged as at bottom right side of the Mura region when Bi<Pi<Ri and Rj<Pj<Bj.

Finally, distribution for sampling points is done in accordance with the preset distribution strategies for respective portions of the Mura region. For example, the preset distribution strategies are as follows:

Top side of the Mura region: A←B←C←D;
Bottom side of the Mura region: D←C←B←A;
Left side of the Mura region: A←C←B←D;
Right side of the Mura region: B←D←A←C;
Top left side of the Mura region: A←C←B←D;
Top right side of the Mura region: B←D←A←C;
Bottom left side of the Mura region: C←A←D←B; and
Bottom right side of the Mura region: D←B←C←A.

Arrow direction indicates priority in selection. Through the above distribution, choice is made to boundary points when two or more boundary points are included in one block, and only one boundary point is stored as the sampling point of the block.

It also should be noted that the above distribution strategies are only used for illustrating preferred embodiments for distribution of the sub-pixel elements and are not constructed to limit the present disclosure.

Only a value reserved as a sampling point of the block is stored as per the data in the original DeMura Table corresponding to the sub-pixel element of the point. It is readily understood that the size of compressed DeMura Table is one fourth of that of the original DeMura Table.

Further, after determining that the numerical value (binary) for each sampling point in the DeMura Table has been obtained, the partition to which the sampling point of each block represented by two binary numbers (i.e. 00, 01, 10 or 11) belongs and the numerical value of the sampling point are stored together as a new DeMura Table. For example, the capacity of a flash for storing the original DeMura Table is reduced from at least 4*8 bit*Blocks to 10 bits*Blocks when a binary bit representing a partition is added to an end of gray scale data (8 bit binary) of each sampling point as an index.

The data compression method in the embodiments of the present disclosure may enable the size of the original DeMura Table to be compressed from 4×8 bits×Blocks to 10 bits×Blocks, to obtain a considerable compression rate, which significantly reduces data volume and thus saves storage cost and is simple to operate.

Figure 6:
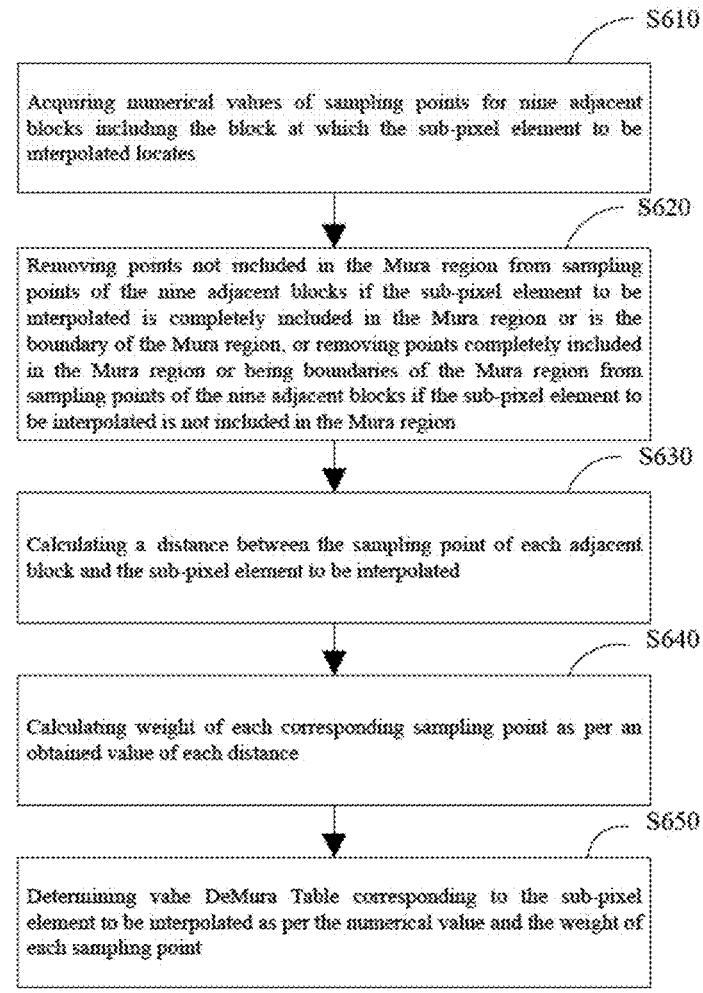
FIG. 6 is a flow chart of a data decompression method of the DeMura Table, according to another embodiment of the present disclosure.

When using the compressed DeMura Table, the data therein should be restored. For this problem, in another embodiment of the present disclosure, a data decompression method by interpolation is proposed as shown in FIG. 6. The data decompression method comprises the following steps.

In step S610, the numerical values of sampling points are obtained for nine adjacent blocks including the block at which the sub-pixel element to be interpolated locates.

In step S620, points not included in the Mura region are removed from the sampling points of the nine adjacent blocks if the sub-pixel element to be interpolated is completely included in the Mura region or is the boundary of the Mura region, and points completely included in the Mura region or taken as boundaries of the Mura region are removed from the sampling points of the nine adjacent blocks if the sub-pixel element to be interpolated is not included in the Mura region.

In step S630, a distance is calculated between the sampling point of each of the adjacent blocks and the sub-pixel element to be interpolated.

In step S640, weight of each corresponding sampling point is calculated as per the obtained value of the distance.

In step S650, the value of data in the DeMura Table corresponding to the sub-pixel element to be interpolated is determined as per the value and weight of each sampling point.

Illustration is made below in conjunction with FIG. 7.

Figure 7:
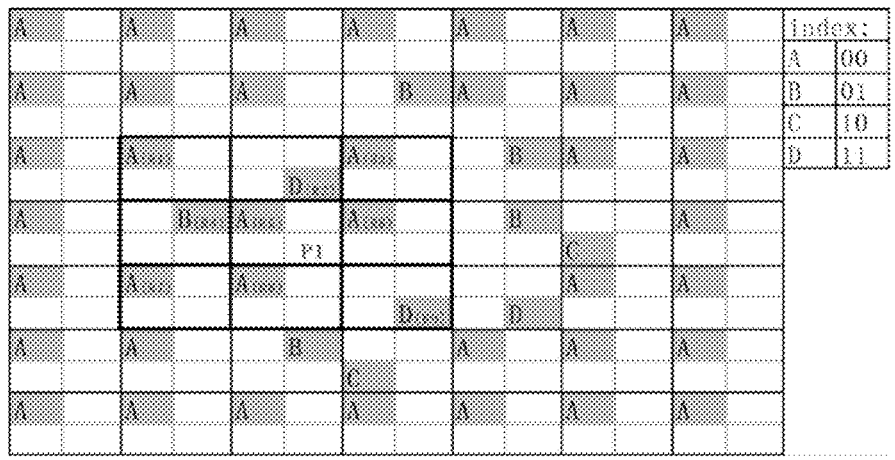
FIG. 7 is an exemplary diagram for a data decompression method of the DeMura Table, according to another embodiment of the present disclosure.

As shown in FIG. 7, if interpolation is desired for point P1 in the figure, then nine blocks (including the block at which the P1 locates) in eight directions at the top, bottom, left and right etc. of the block at which P1 locates are selected, and the sampling points for the nine blocks are R1 (Partition A), R2 (Partition D), R3 (Partition A), R4 (Partition B), R5 (the block at which the point P1 locates, Partition A), R6 (Partition A), R7 (Partition A), R8 (Partition A), and R9 (Partition D).

Judgment is made for the point P1 which is a sub-pixel element completely included in the Mura region, and thus points not included in the Mura region are removed as per step S620, i.e., R1 (Partition A) and R7 (Partition A) are removed.

Distances between reserved adjacent sampling points and P1 are calculated and recorded as $D_{R2}$, $D_{R3}$, $D_{R4}$, $D_{R5}$, $D_{R6}$, $D_{R8}$, $D_{R9}$, respectively.

Then, the weight $\lambda_i$ corresponding to each sampling point is calculated as per equation (1):

$$\lambda_i = \frac{\frac{1}{D_i}}{\sum_{i=1}^{n} \frac{1}{D_i}}, \quad (1)$$

wherein, $D_i$ is the distance between the sampling point of each adjacent block and the sub-pixel element to be interpolated; n is the number of sampling points of adjacent blocks; and i is a natural number for indicating sampling point of each adjacent block.

The value $V_P$ of data in the DeMura Table corresponding to the sub-pixel element to be interpolated is determined as per equation (2):

$$V_P = \sum_{i=1}^{n} V_i * \lambda_i, \quad (2)$$

wherein, $V_i$ is the numerical value of the sampling point of each adjacent block; $\lambda_i$ is the weight of the sampling point corresponding to each adjacent block; n is the number of sampling points of adjacent blocks; and i is a natural number indicating the sampling point of each adjacent block.

In this example, $$V_P = V_{R2}*\lambda_{R2} + V_{R3}*\lambda_{R3} + V_{R4}*\lambda_{R4} + V_{R5}*\lambda_{R5} + V_{R6}*\lambda_{R6} + V_{R8}*\lambda_{R8} + V_{R9}+\lambda_{R9}.$$

The method in the embodiments of the present disclosure may allow decompression operation for compressed DeMura Table, and the data obtained from decompression is closer to the original data, and can be implemented with small error, in simple operation, and at high speed.

Figure 8:
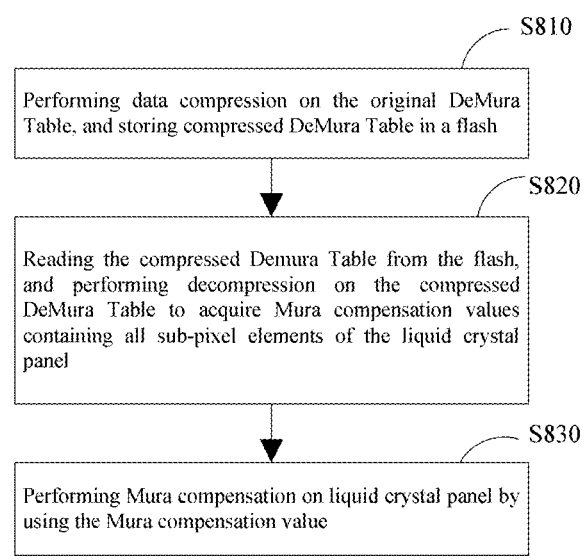
FIG. 8 is a flow chart of a Mura compensation method, according to yet another embodiment of the present disclosure.

The methods for data compression and decompression of DeMura Table in the above embodiments can be combined to compensate for Mura defects of a liquid crystal display device. Particularly, a Mura compensation method is proposed in another embodiment of the present disclosure, as shown in FIG. 8, which comprises the following steps.

In step S810, data compression is performed on the original DeMura Table by using the data compression method of DeMura Table in the above embodiment, and the compressed DeMura Table is stored in a flash.

In step S820, compressed DeMura Table is read from the flash, and decompression is performed on the compressed DeMura Table by using the data decompression method of DeMura Table in the above embodiment, to acquire Mura compensation values of all sub-pixel elements of the liquid crystal panel.

In step S830, Mura compensation is performed on liquid crystal panel by using the Mura compensation value.

Operation process for the above steps may be obtained from the previous embodiment and will not be described in detail.

The Mura compensation method in the embodiment of the present disclosure may combine advantages of the methods for data compression and decompression, to not only effectively reduce the capacity of the storage device and reduce cost, but also rapidly and accurately re-acquire Mura compensation data and effectively compensate for Mura defects.

Actually, the process for data compression of original DeMura Table is generally completed by personal computers or processors, including Mura extraction, Mura edge detection, distribution of sampling points, generation of a new DeMura Table, etc. The newly generated DeMura Table is stored in a storage device (such as a flash), and then the compressed DeMura Table is restored by a hardware system using inverse distance to a power algorithm, to obtain a whole sheet of compensation image which is stored in a DDR3, and DeMura process is implemented as per the compensation image obtained from restoration.

Although embodiments disclosed in the present disclosure are as above, the described contents are only embodiments adopted for better understanding of the present disclosure and are not intended to limit the present disclosure. Any modifications and changes with regard to the form and detail of implementation may be made by any person skilled in the art to which the present disclosure belongs without departing from spirit and scope disclosed in the present disclosure, but the scope of the present disclosure still has to follow the scope defined by the appended claims.

The invention claimed is:

1. A data compression method of DeMura Table, comprising the steps of:
    acquiring image information of a display panel;
        dividing the sub-pixel elements included in the display panel into four partitions;
        acquiring image information of the four partitions respectively; and
        acquiring image information of a whole display panel based on the image information of the four partitions;
    processing the image information of the display panel by a DeMura algorithm to obtain an original DeMura Table;
    performing region extraction based on the original DeMura Table to designate a range of a Mura region;
    performing edge detection based on the Mura region obtained from the extraction to acquire boundary information of the Mura region; and
    distributing each sub-pixel element included in the display panel as per results from the region extraction and the edge detection to determine a numerical value of each sampling point in the DeMura Table.

2. The data compression method of claim 1, wherein four sub-pixels obtained from intersecting each two rows and two columns are grouped into one block, and the four sub-pixels in the block belong to four different partitions.

3. The data compression method of claim 2, wherein the step of performing region extraction based on the original DeMura Table to designate a range of a Mura region comprises:
    calculating a mean value of data in the Table based on the original DeMura Table;
    comparing each datum in the original DeMura Table with the mean value; and
    determining that a sub-pixel element corresponding to the compared datum is included in the Mura region when an absolute value of a difference between the compared datum and the mean value is larger than a preset threshold; or
    determining that a sub-pixel element corresponding to the compared datum is not included in the Mura region when an absolute value of a difference between the compared datum and the mean value is smaller than or equal to a preset threshold.

4. The data compression method of claim 3, wherein the step of distributing each sub-pixel element included in the display panel as per results from the region extraction and the edge detection to determine a numerical value of each sampling point in the DeMura Table comprises:
    determining, if a sub-pixel element is not included in the Mura region or completely included in the Mura region, a sub-pixel element of a selected partition in the block to which the sub-pixel element not included in the Mura region or completely included in the Mura region belongs as a sampling point of the block, and taking data in the original DeMura Table corresponding to the sub-pixel element in the selected partition as the numerical value of the sampling point of the block; or
    taking, if a sub-pixel element is boundary of the Mura region, the sub-pixel element as the sampling point of the block to which the sub-pixel element belongs, and taking data in the original DeMura Table corresponding to the sub-pixel element as the numerical value of the sampling point of the block.

5. The data compression method of claim 4, wherein after determining that the numerical value for each sampling point in the DeMura Table has been obtained, the partition to which the sampling point of each block represented by two binary numbers belongs and the numerical value of the sampling point are stored together as a new DeMura Table.

6. A data decompression method of DeMura Table, comprising the steps of:

acquiring numerical values of sampling points for nine adjacent blocks including a block at which a sub-pixel element to be interpolated locates;

removing points not included in the Mura region from the sampling points of the nine adjacent blocks if the sub-pixel element to be interpolated is completely included in the Mura region or is boundary of the Mura region, or removing points completely included in the Mura region or being boundaries of the Mura region from the sampling points of the nine adjacent blocks if the sub-pixel element to be interpolated is not included in the Mura region;

calculating a distance between the sampling point of each adjacent block and the sub-pixel element to be interpolated;

calculating weight of each corresponding sampling point as per an obtained value of each distance; and determining value of data in the DeMura Table corresponding to the sub-pixel element to be interpolated as per the numerical value and the weight of each sampling point.

7. The data decompression method of DeMura Table of claim 6, wherein weight $\lambda_i$ corresponding to each sampling point is calculated as per the following equation:

$$\lambda_i = \frac{\frac{1}{D_i}}{\sum_{i=1}^{n} \frac{1}{D_i}},$$

wherein, $D_i$ is the distance between the sampling point of each adjacent block and the sub-pixel element to be interpolated; n is number of sampling points of the adjacent blocks; and i is a natural number indicating the sampling point of each adjacent block.

8. The data decompression method of DeMura Table of claim 6, wherein value $V_P$ of data in the DeMura Table corresponding to the sub-pixel element to be interpolated is determined as per the following equation:

$$V_P = \sum_{i=1}^{n} V_i * \lambda_i,$$

wherein, $V_i$ is the numerical value of the sampling point of each adjacent block; $\lambda_i$ is the weight of the sampling point of each adjacent block; n is the number of the sampling points of the adjacent blocks; and i is a natural number indicating the sampling point of each adjacent block.

9. A Mura compensation method, comprising:

performing data compression on original DeMura Table by using a data compression method of DeMura Table, and storing compressed DeMura Table in a flash, wherein the data compression method of DeMura Table comprises the steps of:

acquiring image information of a display panel;

processing the image information of the display panel by a DeMura algorithm to obtain an original DeMura Table;

performing region extraction based on the original DeMura Table to designate a range of a Mura region;

performing edge detection based on the Mura region obtained from the extraction to acquire boundary information of the Mura region; and distributing each sub-pixel element included in the display panel as per results from the region extraction and the edge detection to determine numerical value of each sampling point in the DeMura Table; and reading the compressed DeMura Table from the flash, and performing decompression on the compressed DeMura Table by using a data decompression method of DeMura Table to acquire Mura compensation values containing all sub-pixel elements of a liquid crystal panel, wherein the data decompression method of DeMura Table comprises:

acquiring numerical values of sampling points for nine adjacent blocks including a block at which a sub-pixel element to be interpolated locates;

removing points not included in the Mura region from the sampling points of the nine adjacent blocks if the sub-pixel element to be interpolated is completely included in the Mura region or boundary of the Mura region, or removing points completely included in the Mura region or being boundaries of the Mura region from the sampling points of the nine adjacent blocks if the sub-pixel element to be interpolated is not included in the Mura region;

calculating distance between the sampling point of each adjacent block and the sub-pixel element to be interpolated;

calculating weight of each corresponding sampling point as per an obtained value of each distance;

determining a value of data in the DeMura Table corresponding to the sub-pixel element to be interpolated as per the numerical value and the weight of each sampling point; and performing Mura compensation of the liquid crystal panel by using the Mura compensation values.

* * * * *